United States Patent
Sun

(10) Patent No.: US 10,826,455 B2
(45) Date of Patent: Nov. 3, 2020

(54) MUTE CONTROL CIRCUIT USED UPON POWER-ON OR POWER-OF, CONTROL METHOD, AND AUDIO DEVICE

(71) Applicant: JRD Communication (Shenzhen) LTD., Shenzhen (CN)

(72) Inventor: Liangcai Sun, Shenzhen (CN)

(73) Assignee: JRD Communication (Shenzhen) LTD., Shenzhen (CN)

( * ) Notice: Subject to any disclaimer, the term of this patent is extended or adjusted under 35 U.S.C. 154(b) by 0 days.

(21) Appl. No.: 16/637,762

(22) PCT Filed: Aug. 8, 2018

(86) PCT No.: PCT/CN2018/099372
§ 371 (c)(1),
(2) Date: Feb. 10, 2020

(87) PCT Pub. No.: WO2019/029563
PCT Pub. Date: Feb. 14, 2019

(65) Prior Publication Data
US 2020/0244241 A1    Jul. 30, 2020

(30) Foreign Application Priority Data
Aug. 10, 2017 (CN) .......................... 2017 1 0679849

(51) Int. Cl.
*H04R 3/00* (2006.01)
*H03G 3/34* (2006.01)
*G06F 1/26* (2006.01)

(52) U.S. Cl.
CPC .............. *H03G 3/348* (2013.01); *G06F 1/26* (2013.01); *H04R 3/00* (2013.01); *H04R 3/007* (2013.01)

(58) Field of Classification Search
CPC .......... H03G 3/34; H03G 3/345; H03G 3/348; G06F 1/26; G06F 1/263; G06F 1/30;
(Continued)

(56) References Cited

U.S. PATENT DOCUMENTS 8,335,322 B2    12/2012 Wang
8,433,943 B2 *   4/2013 Lin .......................... G06F 1/263
                                              713/340
(Continued)

FOREIGN PATENT DOCUMENTS

CN      200953603       9/2007
CN      101174824       5/2008
(Continued)

OTHER PUBLICATIONS

International Search Report and the Written Opinion dated Oct. 29, 2018 From the International Searching Authority Re. Application No. PCT/CN2018/099372 and its Translation of Search Report into English. (10 Pages).

*Primary Examiner* — Thang V Tran

(57) ABSTRACT

A mute control circuit used upon power-on or power-off comprises a charge/discharge module, a first switch module and a second switch module. Upon power-on or power-off, charging or discharging is performed between the charge/discharge module and a power supply end. Upon charging or discharging, the charge/discharge module outputs a first level to the first switch module to control turning on of the same, and the first switch module outputs a second level to the second switch module to control turning on of the second switch module, such that the second switch module outputs a high level to a mute circuit to activate operation of the mute circuit. Also provided are a control method and an audio device.

18 Claims, 2 Drawing Sheets

(58) Field of Classification Search
CPC ........... H03F 1/303; H03F 1/305; H04R 3/00;
H04R 3/007; H04R 2430/00; H03B 29/00
See application file for complete search history.

(56) References Cited

U.S. PATENT DOCUMENTS

| | | | | |
|---|---|---|---|---|
| 2005/0100177 A1* | 5/2005 | Lee | .................. | H03G 3/348 |
| | | | | 381/94.5 |
| 2007/0154026 A1* | 7/2007 | Chiu | .................. | H03F 1/305 |
| | | | | 381/71.1 |
| 2008/0137882 A1* | 6/2008 | Tsai | .................. | H03F 3/187 |
| | | | | 381/94.5 |
| 2009/0226007 A1 | 9/2009 | Nagashima | | |
| 2010/0183166 A1* | 7/2010 | Sun | .................. | H03F 1/0205 |
| | | | | 381/86 |
| 2012/0014536 A1* | 1/2012 | Wang | .................. | H03F 1/52 |
| | | | | 381/106 |
| 2015/0046728 A1* | 2/2015 | Ma | .................. | G01R 31/40 |
| | | | | 713/300 |

FOREIGN PATENT DOCUMENTS

| | | |
|---|---|---|
| CN | 201238284 | 5/2009 |
| CN | 202059555 | 11/2011 |
| CN | 102333264 | 1/2012 |
| CN | 203708454 | 7/2014 |
| CN | 205666814 | 10/2016 |
| CN | 107396243 | 11/2017 |
| CN | 206865726 | 1/2018 |
| JP | 2014-191253 | 10/2014 |
| JP | 2017-130967 | 7/2017 |
| KR | 200151266 Y1 * | 7/1999 |
| TW | 201125375 | 7/2011 |
| WO | WO2019/029563 | 2/2019 |

* cited by examiner

US 10,826,455 B2

MUTE CONTROL CIRCUIT USED UPON POWER-ON OR POWER-OF, CONTROL METHOD, AND AUDIO DEVICE

RELATED APPLICATIONS

This application is a National Phase of PCT Patent Application No. PCT/CN2018/099372 having International filing date of Aug. 8, 2018, which claims the benefit of priority of Chinese Patent Application No. 201710679849.X filed on Aug. 10, 2017. The contents of the above applications are all incorporated by reference as if fully set forth herein in their entirety.

FIELD

The present invention relates to audio device technologies, and more particularly to a mute control circuit used upon power-on or power-off, a control method and an audio device.

For current products with a sound box or a speaker, it is easily to have a pop sound upon power-on, at the time some coupling capacitors of a central process unit (CPU) and a power amplifier system are being charged. Upon power-off, discharging processes of the coupling capacitors may cause the pop sound easily. If the pop sound is not under control, it is possible to cause damage of a device upon system power-on or power-off. The existence of the pop sound also has a great impact on product experience. For a good audio product, sound is outputted only when the system normally produces a sound and it should always be muted upon power-on and power-off.

Audio products generally have a software control system. Due to the existence of a micro central unit (MCU), the software can control the voltage level of enable pins via an input/output (IO) port in normal operations of the system; however, the IO port is uncontrollable upon system power-on and power-off. Therefore, it is necessary to implement controlling the voltage level of the enable pins by hardware, thereby controlling the generation of pop sound.

Therefore, the existing arts are needed to be improved.

SUMMARY OF THE INVENTION

Embodiments of the present invention provide a mute control circuit used upon power-on or power-off, a control method and an audio device, in which a low-cost and easily controlled circuit is adopted to be able to output high voltage level to a mute circuit upon power-on and power-off to control the mute circuit to be activated, thereby eliminating the pop sound generated upon power-on or power-off, and improving user experience on the audio devices.

In a first aspect, the embodiments of the present invention provide a mute control circuit used upon power-on or power-off, connected to a power supply end and a mute circuit of an audio device, wherein the mute control circuit used upon power-on or power-off includes a charge/discharge module, a first switch module and a second switch module; upon power-on, the charge/discharge module is charged from the power supply end, upon power-off, the charge/discharge module discharges into the power supply end, upon charging or discharging, the charge/discharge module outputs a first level to the first switch module to control the first switch module to be in a turned-on state, the first switch module outputs a second level to the second switch module to control the second switch module to be in the turned-on state, the second switch module outputs high voltage level to the mute circuit to control the mute circuit to be activated.

Further, in the mute control circuit used upon power-on or power-off, the charge/discharge module includes a charge/discharge unit and a separation unit, the separation unit controls a charging current direction and a discharging current direction upon power-on and power-off, the charge/discharge unit performs charging or discharging based on the charging current direction and the discharging current direction.

Further, in the mute control circuit used upon power-on or power-off, the charge/discharge unit includes a first capacitor and a second capacitor, the separation unit includes a first diode, a second diode and a first resistor; a positive electrode of the first diode is connected to a negative electrode of the second diode, one end of the first resistor and the power supply end, the negative electrode of the first diode is connected to the first switch module and the second switch module and is further grounded via the second capacitor; the positive electrode of the second diode is connected to the other end of the first resistor and the first switch module and is further grounded via the first capacitor.

Further, in the mute control circuit used upon power-on or power-off, the first switch module includes a second resistor, a third resistor and a first triode; one end of the second resistor is connected to the positive electrode of the second diode and the other end of the second resistor is connected to a base electrode of the first triode; an emitter electrode of the first triode is connected to one end of the third resistor and the other end of the third resistor is connected to the negative electrode of the first diode, a collector electrode of the first triode is connected to the second switch module.

Further, in the mute control circuit used upon power-on or power-off, the second switch module includes a fourth resistor, a fifth resistor and a second triode; one end of the fourth resistor is connected to the collector electrode of the first triode and the other end of the fourth resistor is connected to the base electrode of the second triode; the collector electrode of the second triode is connected to the negative electrode of the first diode and the emitter electrode of the second triode is connected to one end of the fifth resistor and the mute circuit; the other end of the fifth resistor is grounded.

Further, in the mute control circuit used upon power-on or power-off, the first triode is a PNP triode.

Further, in the mute control circuit used upon power-on or power-off, the second triode is an NPN triode.

In a second aspect, the embodiments of the present invention further provide a mute control method used upon power-on or power-off, which includes steps of:

upon power-on charging or power-off discharging, utilizing a charge/discharge module to output a first level to a first switch module to control the first switch module to be in a turned-on state;

utilizing the first switch module to output a second level to a second switch module to control the second switch module to be in the turned-on state;

utilizing the second switch module to output high voltage level to a mute circuit to control the mute circuit to be activated.

In a third aspect, the embodiments of the present invention further provide an audio device, including a power supply end, a mute circuit and a mute control circuit used upon power-on or power-off, the mute control circuit used upon power-on or power-off is connected to the power supply end and the mute circuit;

the mute control circuit used upon power-on or power-off includes a charge/discharge module, a first switch module and a second switch module; upon power-on, the charge/discharge module is charged from the power supply end, upon power-off, the charge/discharge module discharges into the power supply end, upon charging or discharging, the charge/discharge module outputs a first level to the first switch module to control the first switch module to be in a turned-on state, the first switch module outputs a second level to the second switch module to control the second switch module to be in the turned-on state, the second switch module outputs high voltage level to the mute circuit to control the mute circuit to be activated;

the first level is low voltage level and the second level is high voltage level.

Further, in the audio device, the charge/discharge module includes a charge/discharge unit and a separation unit, the separation unit controls a charging current direction and a discharging current direction upon power-on and power-off, the charge/discharge unit performs charging or discharging based on the charging current direction and the discharging current direction.

Further, in the audio device, the charge/discharge unit includes a first capacitor and a second capacitor, the separation unit includes a first diode, a second diode and a first resistor; a positive electrode of the first diode is connected to a negative electrode of the second diode, one end of the first resistor and the power supply end, the negative electrode of the first diode is connected to the first switch module and the second switch module and is further grounded via the second capacitor; the positive electrode of the second diode is connected to the other end of the first resistor and the first switch module and is further grounded via the first capacitor.

Further, in the audio device, upon power-on at the power supply end, the first capacitor is charged from the power supply end via the first resistor and the second capacitor is charged from the power supply end via the first diode, low voltage level is outputted to the first switch module during charging the first capacitor; upon power-off at the power supply end, a discharging path from the second capacitor to the power supply end is isolated due to an isolation function of the first diode, such that electric charges in the second capacitor are discharged through the first switch module, and the electric charges in the first capacitor are released through the second diode, making a voltage signal outputted to the first switch module at low voltage level, thereby controlling the first capacitor and the second capacitor to perform charging or discharging according to a preset path.

Further, in the audio device, the first switch module includes a second resistor, a third resistor and a first triode; one end of the second resistor is connected to the positive electrode of the second diode and the other end of the second resistor is connected to a base electrode of the first triode; an emitter electrode of the first triode is connected to one end of the third resistor and the other end of the third resistor is connected to the negative electrode of the first diode, a collector electrode of the first triode is connected to the second switch module.

Further, in the audio device, the second switch module includes a fourth resistor, a fifth resistor and a second triode; one end of the fourth resistor is connected to the collector electrode of the first triode and the other end of the fourth resistor is connected to the base electrode of the second triode; the collector electrode of the second triode is connected to the negative electrode of the first diode and the emitter electrode of the second triode is connected to one end of the fifth resistor and the mute circuit; the other end of the fifth resistor is grounded.

Further, in the audio device, the first triode is a PNP triode.

Further, in the audio device, the second triode is an NPN triode.

Further, in the audio device, upon power-on at the power supply end, a voltage signal inputted to the base electrode of the first triode is at low voltage level, a power supply voltage at the power supply end reaches the emitter electrode of the first triode via the first diode and the third resistor, when a voltage difference between the emitter electrode and the base electrode of the first triode is greater than 0.7V, the turned-on state maintains for the first triode and both of voltages of the collector electrode of the first triode connected to the base electrode of the second triode and the emitter electrode of the first triode are at high voltage level such that the first switch module outputs high voltage level to the second switch module; since the emitter electrode of the second triode is grounded, the second triode is controlled to be in the turned-on state and both of voltages of the emitter electrode and the collector electrode of the second triode are at high voltage level, such that an output end of the mute control circuit used upon power-on or power-off outputs high voltage level to the mute circuit to control the mute circuit be activated.

Further, in the audio device, after the first capacitor is charged completely, the first triode is in a turned-off state due to voltage increase of the base electrode of the first triode, and the collector electrode of the first triode outputs low voltage level to the second triode such that the second triode is in the turned-off state, thereby controlling the output end of the mute control circuit used upon power-on or power-off to output low voltage level to the mute circuit.

Further, in the audio device, upon power-off at the power supply end, the second capacitor can perform discharging only via the third resistor and the first triode due to an isolation function of the first diode, and the first capacitor completely releases electric charges immediately via the second diode such that the base electrode of the first triode is at low voltage level, since the emitter electrode of the first triode is at high voltage level under the discharging of the second capacitor, the first triode is controlled to be in the turned-on state and the collector electrode of the first triode is at high voltage level, such that the second triode is in the turned-on state and both of the emitter electrode and the collector electrode of the second triode are at high voltage level, thereby making an output end of the mute control circuit used upon power-on or power-off outputs high voltage level to the mute circuit to control the mute circuit to be activated.

Further, in the audio device, after the second capacitor discharges completely, the first triode is in a turned-off state due to voltage decrease of the emitter electrode of the first triode, and the collector electrode of the first triode outputs low voltage level to the second triode such that the second triode is in the turned-off state, thereby controlling the output end of the mute control circuit used upon power-on or power-off to output low voltage level to the mute circuit.

The present invention discloses a mute control circuit used upon power-on or power-off, a control method and an audio device, the mute control circuit used upon power-on or power-off is connected to a power supply end and a mute circuit of the audio device, the mute control circuit used upon power-on or power-off includes a charge/discharge module, a first switch module and a second switch module;

the charge/discharge module is charged from the power supply end upon power-on, the charge/discharge module discharges into the power supply end upon power-off, the charge/discharge module outputs a first level to the first switch module upon charging or discharging to control the first switch module to be in a turned-on state, the first switch module outputs a second level to the second switch module to control the second switch module to be in the turned-on state, the second switch module outputs high voltage level to the mute circuit to control the mute circuit to be activated. As long as a low-cost and easily controlled circuit is adopted, the high voltage level can be outputted to the mute circuit during power-on and power-off processes to control the mute circuit to be activated, thereby eliminating the pop sound generated upon power-on and power-off and improving user experience on the audio device.

DESCRIPTION OF SPECIFIC EMBODIMENTS OF THE INVENTION

In view of drawbacks of existing audio devices for generation of pop sound upon power-on or power-off, the objective of the present invention is to provide a mute control circuit used upon power-on or power-off, a control method and an audio device, in which a low-cost and easily controlled circuit is adopted to be able to output high voltage level to a mute circuit upon power-on and power-off to control the mute circuit to be activated, thereby eliminating the pop sound generated upon power-on or power-off, and improving user experience on the audio devices.

To make the objectives, technical schemes, and effects of the present invention clearer and more specific, the present invention is described in further detail below with reference to the embodiments in accompanying with the appending drawings. It should be understood that the specific embodiments described herein are merely for interpreting the present invention and the present invention is not limited thereto.

Figure 1:
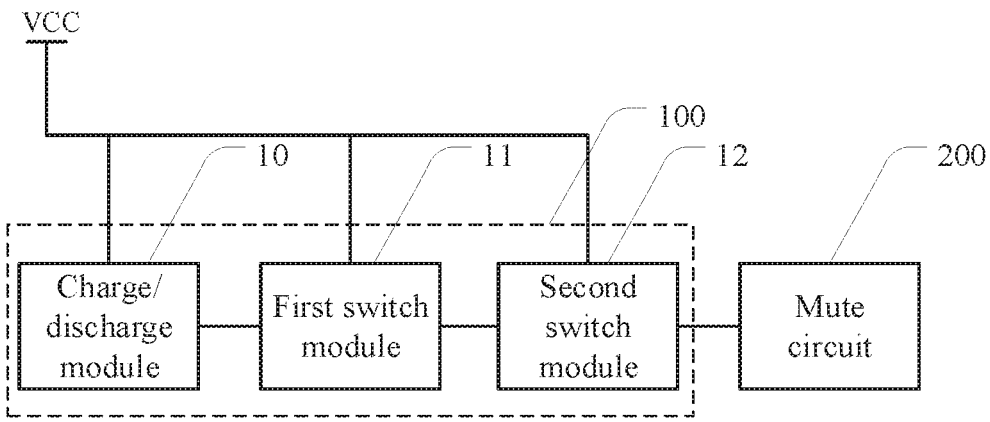
FIG. 1 is a structural block diagram showing a mute control circuit used upon power-on or power-off provided in an embodiment of the present invention.

Referring to FIG. 1, a mute control circuit 100 used upon power-on or power-off, provided in the present invention, is connected to a power supply end and a mute circuit 200 of an audio device. The power supply end can be a VCC power supply end. The mute control circuit 100 includes a charge/discharge module 10, a first switch module 11 and a second switch module 12. All of the charge/discharge module 10, the first switch module 11 and the second switch module 12 are connected to the VCC power supply end of the audio device, and the charge/discharge module 10, the first switch module 11 and the second switch module 12 are sequentially connected to each other. The second switch module 12 is further connected to the mute circuit 200. An operation state of the mute circuit 200 is controlled by a voltage signal outputted by the second switch module 12, thereby activating or deactivating the mute circuit 200.

Specifically, upon the audio device is powered on, the VCC power supply end provides a direct-current (DC) power supply voltage to the mute control circuit 100 and meanwhile, the charge/discharge module 10 is being charged. Upon the audio device is powered off, electricity stored in the charge/discharge module 10 will be released and meanwhile, the charge/discharge module 10 is discharging. Upon power-on charging or power-off discharging, the charge/discharge module 10 outputs a first level to the first switch module 11 to control the first switch module 11 to be in a turned-on state. After that, the first switch module 11 outputs a second level to the second switch module 12 to control the second switch module 12 to be in the turned-on state, such that the second switch module 12 outputs high voltage level to the mute circuit 200 to control the mute circuit 200 to be activated, thereby eliminating the pop sound generated upon power-on and power-off, solving the problem that mute cannot be realized during power-on and power-off processes due to uncontrollable controller input/output (IO) port, and improving user experience.

In the present embodiment, the first level is low voltage level and the second level is high voltage level. Of course, this may be adjusted in other embodiments according to actual needs. The present invention is not limited thereto, as long as it is able to control the second switch module 12 to output high voltage level to the mute circuit 200 to make it function normally.

Figure 2:
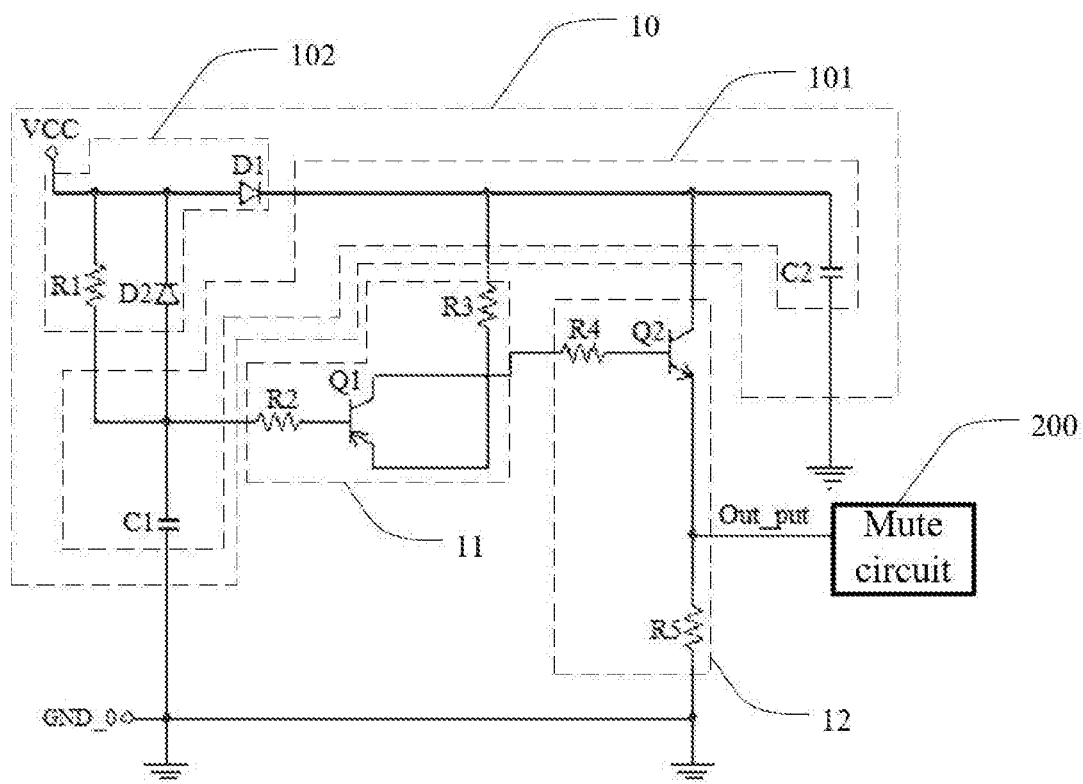
FIG. 2 is a circuit diagram showing a mute control circuit used upon power-on or power-off provided in an embodiment of the present invention.

Further, also referring to FIG. 2, the charge/discharge module 10 includes a charge/discharge unit 101 and a separation unit 102. The separation unit 102 is connected to the charge/discharge unit 101. The charge/discharge unit 101 is connected to the first switch module 11. Upon power-on and power-off, the separation unit 102 controls a charging current direction and a discharging current direction. The charge/discharge unit 101 performs charging or discharging according to the charging current direction and the discharging current direction. That is, by deploying the separation unit 102, the present invention controls the current directions during charging and discharging, guarantees that charge/discharge unit 101 performs the charging or discharging based on the preset directions and makes sure accuracy of a voltage signal outputted to the first switch module 11, thereby ensuring the mute circuit 200 be able to operate normally upon power-on and power-off, eliminating the pop sound generated during power-on and power-off processes, and improving reliability of the product.

Specifically, the charge/discharge unit 101 includes a first capacitor C1 and a second capacitor C2. The separation unit 102 includes a first diode D1, a second diode D2 and a first resistor R1. A positive electrode of the first diode D1 is connected to a negative electrode of the second diode D2, one end of the first resistor R1 and the VCC power supply end. The negative electrode of the first diode D1 is connected to the first switch module 11 and the second switch module 12, and is further grounded via the second capacitor C2. The positive electrode of the second diode D2 is connected to the other end of the first resistor R1 and the first switch module 11, and is further grounded via the first capacitor C1.

Upon power-on at the VCC power supply end, the first capacitor C1 is charged from the VCC power supply end via the first resistor R1 and the second capacitor C2 is charged from the VCC power supply end via the first diode D1. Low voltage level is outputted to the first switch module 11 during charging the first capacitor C1. Upon power-off at the VCC power supply end, a discharging path from the second capacitor C2 to the VCC power supply end is isolated due to an isolation function of the first diode D1. Accordingly, electric charges in the second capacitor C2 are discharged through the first switch module 11, and the electric charges in the first capacitor C1 are quickly released through the second diode D2, such that a voltage signal outputted to the first switch module 11 is at low voltage level, thereby controlling the first capacitor C1 and the second capacitor C2 to perform charging or discharging according to a preset path. In such a way, no matter power-on or power-off, the voltage signal outputted to the first switch module 11 is always a low voltage signal, which controls the first switch module 11 to be turned on to further control subsequent signal output, thereby ensuring the mute circuit 200 be able to be activated immediately, eliminating the pop sound during power-on and power-off processes, and making sure mute effect of the audio device upon power-on and power-off.

Further, the first switch module 11 includes a second resistor R2, a third resistor R3 and a first triode Q1. One end of the second resistor R2 is connected to the positive electrode of the second diode D2 and the other end of the second resistor R2 is connected to a base electrode of the first triode Q1. An emitter electrode of the first triode Q1 is connected to one end of the third resistor R3 and the other end of the third resistor R3 is connected to the negative electrode of the first diode D1. A collector electrode of the first triode Q1 is connected to the second switch module 12. In the present embodiment, the first triode Q1 is a PNP triode.

The second switch module 12 includes a fourth resistor R4, a fifth resistor R5 and a second triode R2. One end of the fourth resistor R4 is connected to the collector electrode of the first triode Q1 and the other end of the fourth resistor R4 is connected to the base electrode of the second triode Q2. The collector electrode of the second triode Q2 is connected to the negative electrode of the first diode D1 and the emitter electrode of the second triode Q2 is connected to one end of the fifth resistor R5 and the mute circuit 200. The other end of the fifth resistor R5 is grounded. In the present embodiment, the second triode Q2 is an NPN triode.

As described above, no matter when the first capacitor C1 and the second capacitor C2 are in a charging state upon power-on or when the first capacitor C1 and the second capacitor C2 are in a discharging state upon power-off, the voltage signal inputted to the first triode Q1 via the second resistor R2 is always at low voltage level.

Upon power-on, the voltage signal inputted to the base electrode of the first triode Q1 is at low voltage level, and a power supply voltage at the VCC power supply end reaches the emitter electrode of the first triode Q1 via the first diode D1 and the third resistor D3. When a voltage difference between the emitter electrode and the base electrode is greater than 0.7V, the turned-on state maintains for the first triode Q1 and meanwhile, voltages of the collector electrode of the first triode Q1 connected to the base electrode of the second triode Q2 and the emitter electrode of the first triode Q1 are equal to each other and are both at high voltage level. That is, the first switch module 11 outputs high voltage level to the second switch module 12. Since the emitter electrode of the second triode Q2 is pulled down to the ground, the second triode Q2 is also in the turned-on state, and voltages of the emitter electrode and the collector electrode of the second triode are equal to each other and are both at high voltage level. That is, an output end Out_put of the mute control circuit 100 used upon power-on or power-off outputs high voltage level to the mute circuit 200 to control the mute circuit 200 be activated. After the first capacitor C1 is charged completely, the first triode Q1 is in a turned-off state due to voltage increase of the base electrode of the first triode Q1, and the collector electrode of the first triode Q1 outputs low voltage level to the second triode Q2 such that the second triode Q2 is also in the turned-off state, thereby controlling the output end Out_put to output low voltage level to the mute circuit 200.

Figure 3:
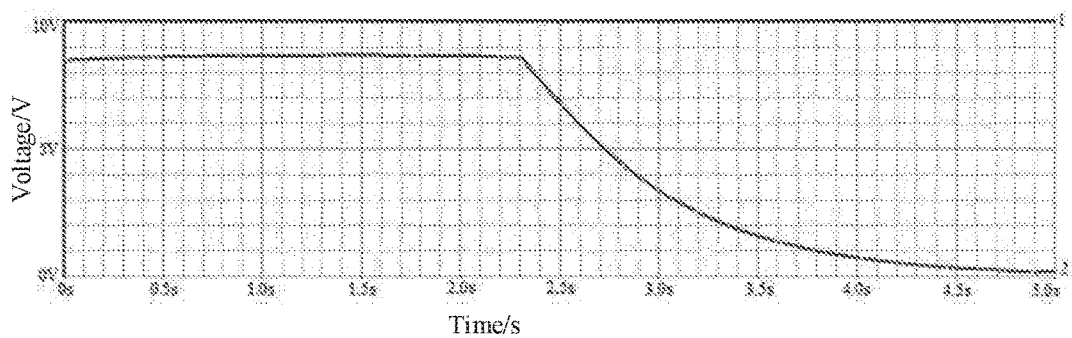
FIG. 3 is a diagram showing a voltage output simulation result upon power-on for the mute control circuit used upon power-on or power-off provided in an embodiment of the present invention.

In the embodiments of the present invention, a power-on voltage output simulation result is shown in FIG. 3, where label "1" indicates a VCC voltage and label "2" indicates a voltage at the output end Out_put. It can be seen that the signal at the output end Out_put of the mute control circuit 100 is instantly changed to high voltage level upon power-on and is kept at the high voltage level for a certain period of time, and after that, is changed to be at low voltage level. For the period of time the high voltage level is maintained, the pop sound is eliminated by the mute circuit 200, thereby improving the mute effect upon power-on. The capacitance of the first capacitor C1 and the resistance of the first resistor R1 determines the period of time the high voltage level is maintained. This can be adjusted based on actual needs to satisfy different application scenarios.

Upon power-off, the second capacitor C2 can perform discharging only via the third resistor R3 and the first triode Q1 due to the isolation function of the first diode D1. During power-off at VCC, the first capacitor C1 completely releases electric charges immediately via the second diode D2 such that the base electrode of the first triode Q1 is at low voltage level. Since the emitter electrode of the first triode Q1 is at high voltage level under the discharging of the second capacitor C2, the first triode Q1 is in the turned-on state and the collector electrode of the first triode Q1 is also at high voltage level, such that the second triode Q2 is in the turned-on state and voltages of the emitter electrode, and the collector electrode of the second triode Q2 are equal to each other and are both at high voltage level. That is, the output end Out_put of the mute control circuit 100 outputs high voltage level to the mute circuit 200 to control the mute circuit 200 to be activated. After the second capacitor C2 discharges completely, the first triode Q1 is in a turned-off state due to voltage decrease of the emitter electrode, and the collector electrode outputs low voltage level to the second triode Q2 such that the second triode Q2 is also in the turned-off state, thereby controlling the output end Out_put to output low voltage level to the mute circuit 200.

Figure 4:
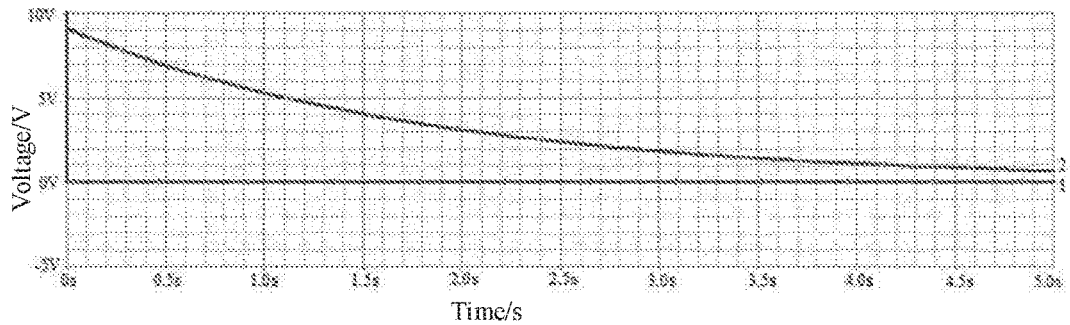
FIG. 4 is a diagram showing a voltage output simulation result upon power-off for the mute control circuit used upon power-on or power-off provided in an embodiment of the present invention.

In the embodiments of the present invention, a power-off voltage output simulation result is shown in FIG. 4, where label "1" indicates a VCC voltage and label "2" indicates a voltage at the output end Out_put. It can be seen that the signal at the output end Out_put of the mute control circuit 100 is instantly changed to high voltage level upon power-off and is kept at the high voltage level for a certain period of time, and after that, is changed to be at low voltage level. For the period of time the high voltage level is maintained, the pop sound is eliminated by the mute circuit 200, thereby improving the mute effect upon power-off. The capacitance of the second capacitor C2 and the resistance of the first resistor R1 determines the period of time the high voltage level is maintained. This can be adjusted based on actual needs to satisfy different application scenarios.

Figure 5:
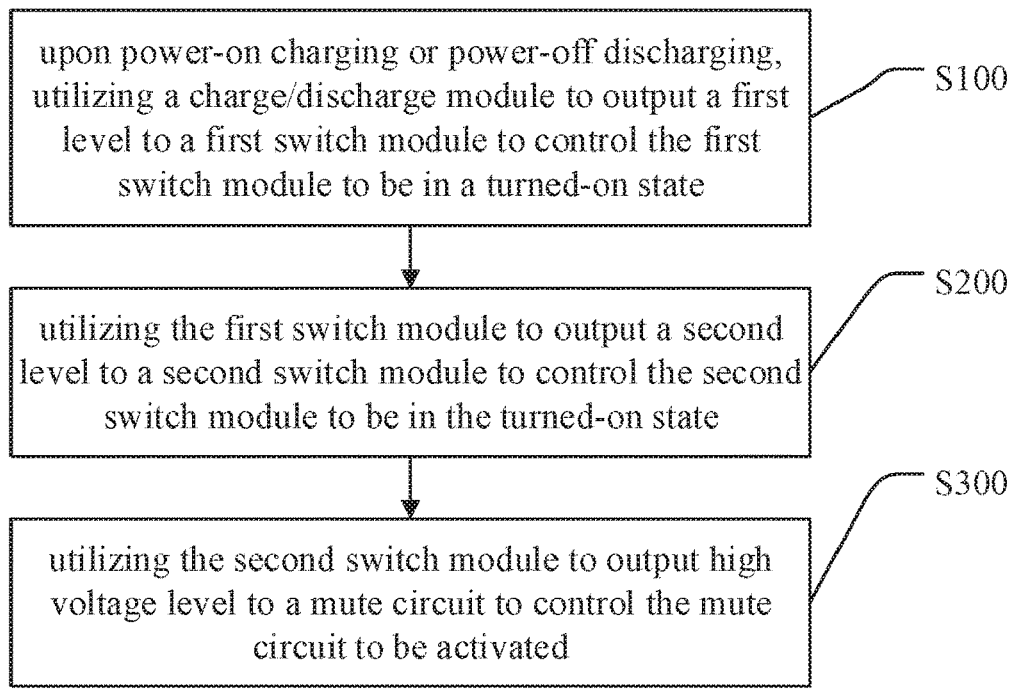
FIG. 5 is a flowchart of a mute control method used upon power-on or power-off provided in an embodiment of the present invention.

Based on the afore-described mute control circuit used upon power-on or power-off, the present invention further correspondingly provides a mute control method used upon power-on or power-off. As shown in FIG. 5, the mute control method includes steps of:

Step S100—upon power-on charging or power-off discharging, utilizing a charge/discharge module to output a first level to a first switch module to control the first switch module to be in a turned-on state;

Step S200—utilizing the first switch module to output a second level to a second switch module to control the second switch module to be in the turned-on state;

Step S300—utilizing the second switch module to output high voltage level to a mute circuit to control the mute circuit to be activated. Based on the afore-described mute control circuit used upon power-on or power-off, the present invention further correspondingly provides an audio device including a power supply end, a mute circuit and the afore-described mute control circuit used upon power-on or power-off. The mute control circuit used upon power-on or power-off has been described detailedly above, and is not repeated herein.

Above all, in the mute control circuit used upon power-on or power-off, the control method and an audio device provided in the present invention, the mute control circuit used upon power-on or power-off is connected to a power supply end and a mute circuit of the audio device, the mute control circuit used upon power-on or power-off includes a charge/discharge module, a first switch module and a second switch module; the charge/discharge module is charged from the power supply end upon power-on, the charge/discharge module discharges into the power supply end upon power-off, the charge/discharge module outputs a first level to the first switch module upon charging or discharging to control the first switch module to be in a turned-on state, the first switch module outputs a second level to the second switch module to control the second switch module to be in the turned-on state, the second switch module outputs high voltage level to the mute circuit to control the mute circuit to be activated. As long as a low-cost and easily controlled circuit is adopted, the high voltage level can be outputted to the mute circuit during power-on and power-off processes to control the mute circuit to be activated, thereby eliminating the pop sound generated upon power-on and power-off and improving user experience on the audio device.

It should be understood that those of ordinary skill in the art may make equivalent modifications or variations according to the technical schemes and invention concepts of the present invention, but all such modifications and variations should be within the appended claims.

What is claimed is:

1. A mute control circuit used upon power-on or power-off, connected to a power supply end and a mute circuit of an audio device, the mute control circuit comprising:
   a charge/discharge module, charged from the power supply end upon power-on and discharging into the power supply end upon power-off;
   a first switch module, connected to the charge/discharge module, wherein upon charging or discharging, the charge/discharge module outputs a first level to the first switch module to control the first switch module to be in a turned-on state; and
   a second switch module, connected to the first switch module, wherein upon charging or discharging, the first switch module outputs a second level to the second switch module to control the second switch module to be in the turned-on state, and the second switch module outputs high voltage level to the mute circuit to control the mute circuit to be activated,
   wherein the charge/discharge module comprises a charge/discharge unit and a separation unit, the charge/discharge unit comprises a first capacitor and a second capacitor, and the separation unit comprises a first diode, a second diode and a first resistor,
   wherein a positive electrode of the first diode is connected to a negative electrode of the second diode, one end of the first resistor and the power supply end, the negative electrode of the first diode is connected to the first switch module and the second switch module and is further grounded via the second capacitor; the positive electrode of the second diode is connected to the other end of the first resistor and the first switch module and is further grounded via the first capacitor,
   wherein upon power-on at the power supply end, the first capacitor is charged from the power supply end via the first resistor and the second capacitor is charged from the power supply end via the first diode, low voltage level is outputted to the first switch module during charging the first capacitor; upon power-off at the power supply end, a discharging path from the second capacitor to the power supply end is isolated due to an isolation function of the first diode, such that electric charges in the second capacitor are discharged through the first switch module, and the electric charges in the first capacitor are released through the second diode, making a voltage signal outputted to the first switch module at low voltage level, thereby controlling the first capacitor and the second capacitor to perform charging or discharging according to a preset path.

2. The mute control circuit according to claim 1, wherein the separation unit controls a charging current direction and a discharging current direction upon power-on and power-off, the charge/discharge unit performs charging or discharging based on the charging current direction and the discharging current direction.

3. The mute control circuit according to claim 1, wherein the first switch module comprises a second resistor, a third resistor and a first triode; one end of the second resistor is connected to the positive electrode of the second diode and the other end of the second resistor is connected to a base electrode of the first triode; an emitter electrode of the first triode is connected to one end of the third resistor and the other end of the third resistor is connected to the negative electrode of the first diode, a collector electrode of the first triode is connected to the second switch module.

4. The mute control circuit according to claim 3, wherein the second switch module comprises a fourth resistor, a fifth resistor and a second triode; one end of the fourth resistor is connected to the collector electrode of the first triode and the other end of the fourth resistor is connected to the base electrode of the second triode; the collector electrode of the second triode is connected to the negative electrode of the first diode and the emitter electrode of the second triode is connected to one end of the fifth resistor and the mute circuit; the other end of the fifth resistor is grounded.

5. The mute control circuit according to claim 3, wherein the first triode is a PNP triode.

6. The mute control circuit according to claim 4, wherein the second triode is an NPN triode.

7. A mute control method used upon power-on or power-off, comprising steps of:

upon power-on charging or power-off discharging, utilizing a charge/discharge module to output a first level to a first switch module to control the first switch module to be in a turned-on state;

utilizing the first switch module to output a second level to a second switch module to control the second switch module to be in the turned-on state; and utilizing the second switch module to output high voltage level to a mute circuit to control the mute circuit to be activated, wherein the charge/discharge module comprises a charge/discharge unit and a separation unit, the charge/discharge unit comprises a first capacitor and a second capacitor, and the separation unit comprises a first diode, a second diode and a first resistor, wherein a positive electrode of the first diode is connected to a negative electrode of the second diode, one end of the first resistor and a power supply end, the negative electrode of the first diode is connected to the first switch module and the second switch module and is further grounded via the second capacitor; the positive electrode of the second diode is connected to the other end of the first resistor and the first switch module and is further grounded via the first capacitor, wherein upon power-on at the power supply end, the first capacitor is charged from the power supply end via the first resistor and the second capacitor is charged from the power supply end via the first diode, low voltage level is outputted to the first switch module during charging the first capacitor; upon power-off at the power supply end, a discharging path from the second capacitor to the power supply end is isolated due to an isolation function of the first diode, such that electric charges in the second capacitor are discharged through the first switch module, and the electric charges in the first capacitor are released through the second diode, making a voltage signal outputted to the first switch module at low voltage level, thereby controlling the first capacitor and the second capacitor to perform charging or discharging according to a preset path.

8. An audio device, comprising a power supply end, a mute circuit and a mute control circuit used upon power-on or power-off, the mute control circuit connected to the power supply end and the mute circuit, the mute control circuit comprising:

a charge/discharge module, charged from the power supply end upon power-on and discharging into the power supply end upon power-off;

a first switch module, connected to the charge/discharge module, wherein upon charging or discharging, the charge/discharge module outputs a first level to the first switch module to control the first switch module to be in a turned-on state; and a second switch module, connected to the first switch module, wherein the first switch module outputs a second level to the second switch module to control the second switch module to be in the turned-on state, and the second switch module outputs high voltage level to the mute circuit to control the mute circuit to be activated, wherein the charge/discharge module comprises a charge/discharge unit and a separation unit, the charge/discharge unit comprises a first capacitor and a second capacitor, and the separation unit comprises a first diode, a second diode and a first resistor, wherein a positive electrode of the first diode is connected to a negative electrode of the second diode, one end of the first resistor and a power supply end, the negative electrode of the first diode is connected to the first switch module and the second switch module and is further grounded via the second capacitor; the positive electrode of the second diode is connected to the other end of the first resistor and the first switch module and is further grounded via the first capacitor, wherein upon power-on at the power supply end, the first capacitor is charged from the power supply end via the first resistor and the second capacitor is charged from the power supply end via the first diode, low voltage level is outputted to the first switch module during charging the first capacitor; upon power-off at the power supply end, a discharging path from the second capacitor to the power supply end is isolated due to an isolation function of the first diode, such that electric charges in the second capacitor are discharged through the first switch module, and the electric charges in the first capacitor are released through the second diode, making a voltage signal outputted to the first switch module at low voltage level, thereby controlling the first capacitor and the second capacitor to perform charging or discharging according to a preset path.

9. The audio device according to claim 8, wherein the separation unit controls a charging current direction and a discharging current direction upon power-on and power-off, the charge/discharge unit performs charging or discharging based on the charging current direction and the discharging current direction.

10. The audio device according to claim 9, wherein first level is low voltage level and the second level is high voltage level.

11. The audio device according to claim 8, wherein the first switch module comprises a second resistor, a third resistor and a first triode; one end of the second resistor is connected to the positive electrode of the second diode and the other end of the second resistor is connected to a base electrode of the first triode; an emitter electrode of the first triode is connected to one end of the third resistor and the other end of the third resistor is connected to the negative electrode of the first diode, a collector electrode of the first triode is connected to the second switch module.

12. The audio device according to claim 11, wherein the second switch module comprises a fourth resistor, a fifth resistor and a second triode; one end of the fourth resistor is connected to the collector electrode of the first triode and the other end of the fourth resistor is connected to the base electrode of the second triode; the collector electrode of the second triode is connected to the negative electrode of the first diode and the emitter electrode of the second triode is connected to one end of the fifth resistor and the mute circuit; the other end of the fifth resistor is grounded.

13. The audio device according to claim 12, wherein the first triode is a PNP triode.

14. The audio device according to claim 13, wherein the second triode is an NPN triode.

15. The audio device according to claim 14, wherein upon power-on at the power supply end, a voltage signal inputted to the base electrode of the first triode is at low voltage level, a power supply voltage at the power supply end reaches the emitter electrode of the first triode via the first diode and the third resistor, when a voltage difference between the emitter electrode and the base electrode of the first triode is greater than 0.7V, the turned-on state maintains for the first triode and both of voltages of the collector electrode of the first triode connected to the base electrode of the second triode and the emitter electrode of the first triode are at high voltage level such that the first switch module outputs high voltage level to the second switch module; since the emitter electrode of the second triode is grounded, the second triode is controlled to be in the turned-on state and both of voltages of the emitter electrode and the collector electrode of the second triode are at high voltage level, such that an output end of the mute control circuit used upon power-on or power-off outputs high voltage level to the mute circuit to control the mute circuit be activated.

16. The audio device according to claim 15, wherein after the first capacitor is charged completely, the first triode is in a turned-off state due to voltage increase of the base electrode of the first triode, and the collector electrode of the first triode outputs low voltage level to the second triode such that the second triode is in the turned-off state, thereby controlling the output end of the mute control circuit used upon power-on or power-off to output low voltage level to the mute circuit.

17. The audio device according to claim 14, wherein upon power-off at the power supply end, the second capacitor can perform discharging only via the third resistor and the first triode due to an isolation function of the first diode, and the first capacitor completely releases electric charges immediately via the second diode such that the base electrode of the first triode is at low voltage level, since the emitter electrode of the first triode is at high voltage level under the discharging of the second capacitor, the first triode is controlled to be in the turned-on state and the collector electrode of the first triode is at high voltage level, such that the second triode is in the turned-on state and both of the emitter electrode and the collector electrode of the second triode are at high voltage level, thereby making an output end of the mute control circuit used upon power-on or power-off outputs high voltage level to the mute circuit to control the mute circuit to be activated.

18. The audio device according to claim 17, wherein after the second capacitor discharges completely, the first triode is in a turned-off state due to voltage decrease of the emitter electrode of the first triode, and the collector electrode of the first triode outputs low voltage level to the second triode such that the second triode is in the turned-off state, thereby controlling the output end of the mute control circuit used upon power-on or power-off to output low voltage level to the mute circuit.

* * * * *